(12) United States Patent
Zeltner et al.

(10) Patent No.: US 9,929,566 B2
(45) Date of Patent: Mar. 27, 2018

(54) POWER ELECTRONIC CIRCUIT AND SYSTEM COMPRISING THE SAME

(71) Applicants: Fraunhofer-Gesellschaft zur Foerderung der angewandten Forschung e.V., Munich (DE); Friedrich-Alexander-Universitaet Erlangen-Nuernberg, Erlangen (DE)

(72) Inventors: Stefan Zeltner, Erlangen (DE); Stefan Endres, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 250 days.

(21) Appl. No.: 14/866,235

(22) Filed: Sep. 25, 2015

(65) Prior Publication Data

US 2016/0013655 A1    Jan. 14, 2016

Related U.S. Application Data

(63) Continuation of application No. PCT/EP2014/053119, filed on Feb. 18, 2014.

(30) Foreign Application Priority Data

Mar. 28, 2013 (DE) ........................ 10 2013 205 706

(51) Int. Cl.
*H02J 4/00* (2006.01)
*H03K 17/691* (2006.01)
*H03K 17/00* (2006.01)

(52) U.S. Cl.
CPC ................ *H02J 4/00* (2013.01); *H03K 17/00* (2013.01); *H03K 17/691* (2013.01); *H03K 2217/0081* (2013.01)

(58) Field of Classification Search
CPC ......... H02J 4/00; H03K 17/00; H03K 17/691; H03K 2217/0081
(Continued)

(56) References Cited

U.S. PATENT DOCUMENTS 5,206,540 A   4/1993  de Sa e Silva et al.
5,384,808 A   1/1995  Van Brunt et al.
(Continued)

FOREIGN PATENT DOCUMENTS

DE      4007539 A1   9/1991
DE     10312704 A1   9/2004
(Continued)

OTHER PUBLICATIONS

Hui et al.; "Coreless Printed Circuit Board (PCB) Transformers for Power MOSFET/IGBT Gate Drive Circuits," *IEEE Transactions on Power Electronics*, May 1999; 14(3):422-430 (abstract).

(Continued)

*Primary Examiner* — John Poos
(74) *Attorney, Agent, or Firm* — Haynes and Boone, LLP; Robert P. Ziemian (57) ABSTRACT

A circuit includes an active element, a drive circuit for the active element and a control logic for providing a control signal for the drive circuit. Further, an interface circuit is provided, which includes a primary terminal for receiving a primary signal and a secondary terminal that is galvanically isolated from the primary terminal. The interface circuit is implemented to provide the primary signal received at the primary terminal to the control logic via the secondary terminal, and to provide, based on the primary signal received at the primary terminal, by means of a rectifier circuit, an auxiliary energy signal for the drive circuit at the secondary terminal.

24 Claims, 5 Drawing Sheets

(58) Field of Classification Search
USPC ......... 327/108, 109, 110, 111, 112; 307/125, 307/126, 127, 128, 129, 130
See application file for complete search history.

(56) References Cited

U.S. PATENT DOCUMENTS

| | | | |
|---|---|---|---|
| 5,900,683 A | 5/1999 | Rinehart et al. | |
| 2008/0106152 A1* | 5/2008 | Maier | G05F 1/569 307/130 |
| 2009/0212759 A1 | 8/2009 | Melanson | |
| 2012/0212075 A1* | 8/2012 | Arnet | H02M 1/08 307/113 |
| 2014/0049117 A1* | 2/2014 | Rahman | H02J 4/00 307/82 |

FOREIGN PATENT DOCUMENTS

| | | |
|---|---|---|
| EP | 1768257 A1 | 3/2007 |
| EP | 2302798 A1 | 3/2011 |
| WO | WO-2004084409 A1 | 9/2004 |

OTHER PUBLICATIONS

International Search Report in related PCT Application No. PCT/EP2014/053119 dated May 14, 2014, with translation; 7 pages.

Mahfoud et al.; "Next Generation Vehicle Network: Web Enable,"*3rd International Conference on Information and Communication Technologies: From Theory to Applications*, Apr. 7, 2008; IEEE, Piscataway, New Jersey, US; pp. 1-7.

Mayer et al.; "Control Concept of the Modular High Frequency Converter for Vehicle Applications," PCIM, May 17, 2011; Bd. Paper 92:17; pp. 556-561.

Zeltner, Stefan; "Studies on insulating low-loss compact drive circuits with integrated regulation of the load current," *Doctoral Thesis*, 2011; University of Erlangen-Nuremberg (FAU) (abstract).

Zeltner et al.; "A compact IGBT driver for high temperature applications," *3rd International Conference on Integrated Power Systems*, 2003, Nuernberg, Germany.

* cited by examiner

POWER ELECTRONIC CIRCUIT AND SYSTEM COMPRISING THE SAME

CROSS-REFERENCE TO RELATED APPLICATIONS

This application is a continuation of copending International Application No. PCT/EP2014/053119, filed Feb. 18, 2014, which is incorporated herein by reference in its entirety, and additionally claims priority from German Application No. DE 10 2013 205 706.7, filed Mar. 28, 2013, which is also incorporated herein by reference in its entirety.

BACKGROUND OF THE INVENTION

The present invention relates to the field of power electronics and in particular to a circuit having an active element, a drive circuit, a control logic and an interface circuit, as well as to a system comprising one or several such circuits.

Frequently, modern power electronic systems include a plurality of power electronic elements that are to be actively controlled, for example switches in the form of IGBTs or MOSFETs. Examples for such power electronic systems can be found in on-board chargers for electronic vehicles, in multiport DC/DC converters for complex energy management tasks or also in converters for RPM-regulated control of electric machines. Realizing such power electronic systems is frequently performed by dividing the system into partial or subsystems, such as into an active front end circuit and a galvanically isolated converter stage in the case of an on-board charger, into several bidirectional boost/buck choppers in the case of multiport DC/DC converters or into several half bridge circuits in motor inverters. Further power electronic systems having a plurality of actively controllable power electronic elements include, for example, inverters for converting direct current generated by solar plants into an alternating current for feeding into an alternating current network.

In the case of power electronic switches, energy, for example in the form of an auxiliary energy signal for supplying the control circuit, and the actual switch control signal are necessitated, for example a gate control signal in the case of realizing the switch by using, for example, IGBTs or field effect transistors. Here, it is necessitated to possibly control a great plurality of active power switches or active power elements in an interference-proof manner and to simultaneously minimize the effort. Further, galvanic isolation between the higher-level control unit facing the user and the actual power electronic unit, e.g. the power module, can be provided or necessitated.

Galvanically isolated drive or control circuits are known in conventional technology. The effort for galvanically isolated control of several power switches is significant. Thus, known approaches also use so-called intelligent power modules (IPM), for example designed for realizing complete sub units, for example in the form of a motor inverter including a braking chopper. These approaches are characterized by extending a typical power module by integrating further functionalities, for example by integrating the drive or control circuit, wherein the common feature of all intelligent power modules can be seen in the fact that a higher-level control unit comprising the necessitated control logic is necessitated, for example for providing respective gate control signals to the IPM.

Further, in conventional technology, approaches are known aiming at reducing the great interface effort for controlling the individual power electronic switches, e.g. the IPM, or the necessitated circuits for providing the necessitated auxiliary supplies. As an example, reference is made to the thesis of S. Zeltner "Untersuchungen zu isolierenden verlustarmen kompakten Ansteuerschaltungen mit integrierter Regelung des Laststroms" ("Analysis concerning isolating low-loss compact control circuits with integrated regulation of the load current"), University of Erlangen, 2011. The concept described therein expands the functionality of a control circuit by regulator units and units for generating the gate control signals, such that this drive or control circuit fulfills the functionality of a controlled current source. Thereby, the interface effort can be reduced, since it is now only necessitated to transfer the auxiliary supply voltages as well as the trigger and set value specifications to the IPM. In this concept, the units for expanding the functionality, the regulator and the PWM unit are on the primary side of the control circuit (i.e., the same are directly connected to the higher-level control unit), which, however, necessitates further measures with respect to signal transmission. Thus, e.g., for interference-proof transmission of a synchronization signal and for transmission of a set value specification, for example, digital transmission or the usage of differential signal transmissions or further galvanic isolations are necessitated. This results in a significant interface effort. Additionally, it is disadvantageous that energy transmission is performed isolated from the gate signal transmission, such that the overall coupling capacitance between the higher-level control unit and the secondary side facing the power electronics is increased.

Further, approaches are known in conventional technology for minimizing the effort in the context of necessitated galvanic isolation and gate signal transmission by transmitting the gate control signal as well as the necessitated auxiliary energy via a common transformer, such as described, for example, by S. Y. Hui in "Coreless Printed Circuit Board (PCB) Transformers for Power MOSFET/IGBT Gate Drive Circuits", IEEE Transactions on Power Electronics, Vol. 14, No. 3, May 1999 or by S. Zeltner et al., "A Compact IGBT Driver for High Temperature Applications", PCIM Europe 2003, Nuremberg 2003, Germany. This results in a reduction of the overall coupling capacitance between primary side and secondary side, however, it is disadvantageous that there are tradeoffs with respect to the power to be transmitted on the one side and the obtainable transmission characteristics of the gate control signal on the other side. For example, the gate control signal can be provided with an undesired delay or an undesired jitter, such that exact and proper control is not possible, in particular not with increasing switching frequencies in power electronic systems, such as can be found when using modern power electronic circuits in SiC or GaN technology. There, this problem increasingly manifests itself and is more and more difficult to solve.

Further, in conventional technology, an approach according to U.S. Pat. No. 5,900,683 by Ford is known, which discloses an isolated gate driver for power circuit elements, where it is intended to control a gate driver by using a first load signal modulated at a first frequency and by using a second load signal modulated at a second frequency, wherein the two frequencies differ from one another and are selected such that the first load signal effects switching on of the transistor and the second load signal effects switching off of the transistor. The disadvantage of this procedure is similar to the disadvantages described above in the context of the approaches of Hui et al and S. Zeltner et al., namely that transmitting the control signals from external sources (typically a central control unit) is performed via and isolation barrier to the switches, such that the above-described problems with respect to interferences of the signals during transmission, in particular with increasing switching frequencies, occur.

Again another approach is described in US 2012/0212075 A1 by Arnet, where a programmable gate controller circuit is provided including at least one programmable gate controller connected to a central controller via a bidirectional connection and to at least one power switch. The control signals are generated in the programmable gate controller and are provided to the switch, wherein the gate controller is programmed by control signals from the central controller. The bidirectional communication takes place via a bidirectional bus, wherein isolation between the central controller and the programmable gate controller is provided. It is a disadvantage of this procedure that the necessitated auxiliary energy signals are provided by additional external sources, such that further galvanically decoupled interfaces are provided for the auxiliary energy supplies (e.g. for gate drivers, logic units, measurement circuits).

SUMMARY

According to an embodiment of the invention, a circuit may have: an active element; a drive circuit for the active element; a control logic for providing a control signal for the drive circuit; and an interface circuit having a primary terminal for receiving a primary signal and a secondary terminal that is galvanically isolated from the primary terminal, wherein the interface circuit is implemented to provide the primary signal received at the primary terminal to the control logic via the secondary terminal, and to provide, based on the primary signal received at the primary terminal, an auxiliary energy signal for the drive circuit at the secondary terminal, and wherein the primary signal includes data for setting and/or programming the control logic, wherein the primary signal includes a waveform allowing energy transmission via the interface circuit with the galvanic isolation.

According to another embodiment, a system may have: a central control unit; and an inventive circuit.

The present invention provides a circuit comprising an active element, a drive circuit for the active element, a control logic for providing a control signal for the drive circuit and an interface circuit having a primary terminal for receiving a primary signal and a secondary terminal that is galvanically isolated from the primary terminal, wherein the interface circuit is implemented to provide the primary signal received at the primary terminal to the control logic via the secondary terminal, and to provide, based on the primary signal received at the primary terminal, an auxiliary energy signal for the drive circuit at the secondary terminal.

According to embodiments, the primary signal includes data for setting and/or programming the control logic, wherein the primary signal comprises a waveform allowing energy transmission via the interface circuit having the galvanic isolation. The primary signal can include a square-wave signal free from steady components with essentially constant frequency. The primary signal can include, for example, a Manchester encoded signal.

According to embodiments, the primary signal includes a serial bitstream.

According to embodiments, the circuit includes a decoder that is implemented to decode the received primary signal for obtaining data for setting and/or programming the control logic. The control logic can include the decoder.

According to embodiments, the interface circuit includes a transformer to the primary side of which the primary signal is applied, and at the secondary side of which the data signal for the control logic and the auxiliary energy signal for the drive circuit can be obtained, for example via a rectifier circuit connected to the secondary side of the transformer.

According to embodiments, the interface circuit is implemented to provide, based on the received primary signal, a further auxiliary energy signal for the control logic at the secondary terminal.

According to embodiments, the active element and the control logic are additionally galvanically isolated or connected via a suitable level shifting circuit (level shifter), wherein the drive circuit can include the element for galvanic isolation of the active element and the control logic or the level shifting circuit.

According to embodiments, the circuit includes a first power terminal and a second power terminal, wherein the active element is connected between the first and second power terminals. The control logic can be connected to the first and second power terminals for sensing a measurement signal.

According to embodiments, the circuit includes a combination of several active and passive power devices, which results in several power terminals and/or inner nodes, wherein the control logic is, alternatively or additionally, connected to the further power terminals or inner nodes for sensing one or several measurement signals.

According to embodiments, the circuit includes a measurement circuit connected to the control logic for providing a measurement signal to the same, wherein the interface circuit is implemented to provide, based on the received primary signal, an auxiliary energy signal for the measurement circuit at the secondary terminal.

According to embodiments, the circuit includes at least one further active element having a further drive circuit allocated thereto, wherein the interface circuit is implemented to provide, based on the received primary signal, an auxiliary energy signal for the further drive circuit. Further, another control logic for providing a further control signal for the further drive circuit can be provided.

According to embodiments, the active element includes one or several power electronic switches, such as IGBTs, FETs, bipolar transistors or others whose control terminals are connected to one or several of the drive circuits.

According to embodiments, the control logic is effective to cause, in response to the data transmitted by the primary signal, a predetermined control of the drive circuit for the active element and/or to perform predetermined measurements and/or controls or regulations.

According to embodiments, the interface circuit is further implemented to effect an output of a signal on the primary side.

Accompanying to embodiments, the primary signal includes correction and/or check information for fault-tolerant transmission.

Further, the present invention provides a system having a sensor control unit and an inventive circuit.

According to embodiments, the system includes a bus for transmitting the primary signal generated by the central control unit to the circuit, wherein the bus can include a two-wire connection between the central control unit and the circuit, wherein the primary terminal of the interface circuit includes a first terminal connected to one wire of the two-wire connection, and a second terminal connected to the other wire of the two-wire connection.

According to embodiments, the system includes at least one further inventive circuit, wherein the at least one further circuit can be connected to the central control unit via a further two-wire connection, or to the primary terminal of the circuit, or to the two-wire connection between the central control unit and the circuit.

Thus, according embodiments, an approach is provided which prevents the above-mentioned problems in the context of known power electronic circuits and which allows secure and reliable control of the active elements of such a circuit even at higher switching frequencies in that the control electronics is provided together with the active elements, such that the necessitated control signals, for example gate control signals are generated in immediate proximity to the active elements and output to the same, such that the above mentioned transmission problems via secure galvanic isolation are prevented. The interface circuit effects the galvanic isolation between the primary side and the secondary side and allows serial data communication from a central unit with the control logic and the provision of an auxiliary energy supply for the drive circuit on the secondary side. The control logic can be set or programmed by the transmitted data in order to effect the desired generation of the gate control signals. Further, it can be provided that the logic circuit performs predetermined measurements or takes on control and/or regulation tasks. Based on the primary signal, in addition to the auxiliary energy supplies for the drive circuits, auxiliary energy supply for operating the logic unit and/or a measurement circuit can be provided.

The inventive approach is advantageous since the same obtains minimum coupling capacitance, since both data communication and energy supply are enabled via the single transformer in the interface circuit, such that additional transformers for feeding in the auxiliary energy supplies, which effect increased coupling, are prevented. Thus, only one transmitter or transformer is necessitated for, e.g., the complete IPM, which can, for example, also be configured as full bridge or in another known circuit configuration.

According to the invention, by configuring the circuit, occurrence of jitter and of delays and the accompanying problems resulting from direct transmission of the gate signals via a secure isolation barrier (galvanic isolation) are avoided or reduced. Further, the inventive circuit allows the usage of any isolation voltages as well as a secure galvanic isolation by the transmitter or transformer. Further, according to the invention, interference-proof transmission due to the galvanic isolation as well as minimum coupling capacitance and low impedance are ensured. By implementing suitable correction and check mechanisms, fault-tolerant transmission can also be easily implemented.

According to embodiments, communication via a bus is provided, which provides a two-wire connection, such that only two reverse polarity protected wires are necessitated for the overall control of the unit, including programming. According to embodiments, a simple control is provided which is based, for example, on the UART standard (UART=Universal Asynchronous Receiver Transmitter) via which typically several IPMs (e.g. 8 IPMs) can be controlled.

A further advantage of the inventive procedure is that the effort with regard to the connectors to be provided and the necessitated wiring is reduced or minimized, as well as the construction size and the resulting costs.

It is another advantage of the present invention that due to the secure galvanic isolation by the transformer the control of the power switches can also be performed by means of so-called level shifters, or via galvanically isolated circuits having low isolation requirements (e.g. only operation isolation).

BRIEF DESCRIPTION OF THE DRAWINGS

Embodiments of the present invention will be detailed subsequently referring to the appended drawings, in which.

DETAILED DESCRIPTION OF THE INVENTION

In the following description of the embodiments of the present invention, the same or equal elements shown in the Figures are provided with the same reference numbers.

Figure 1:
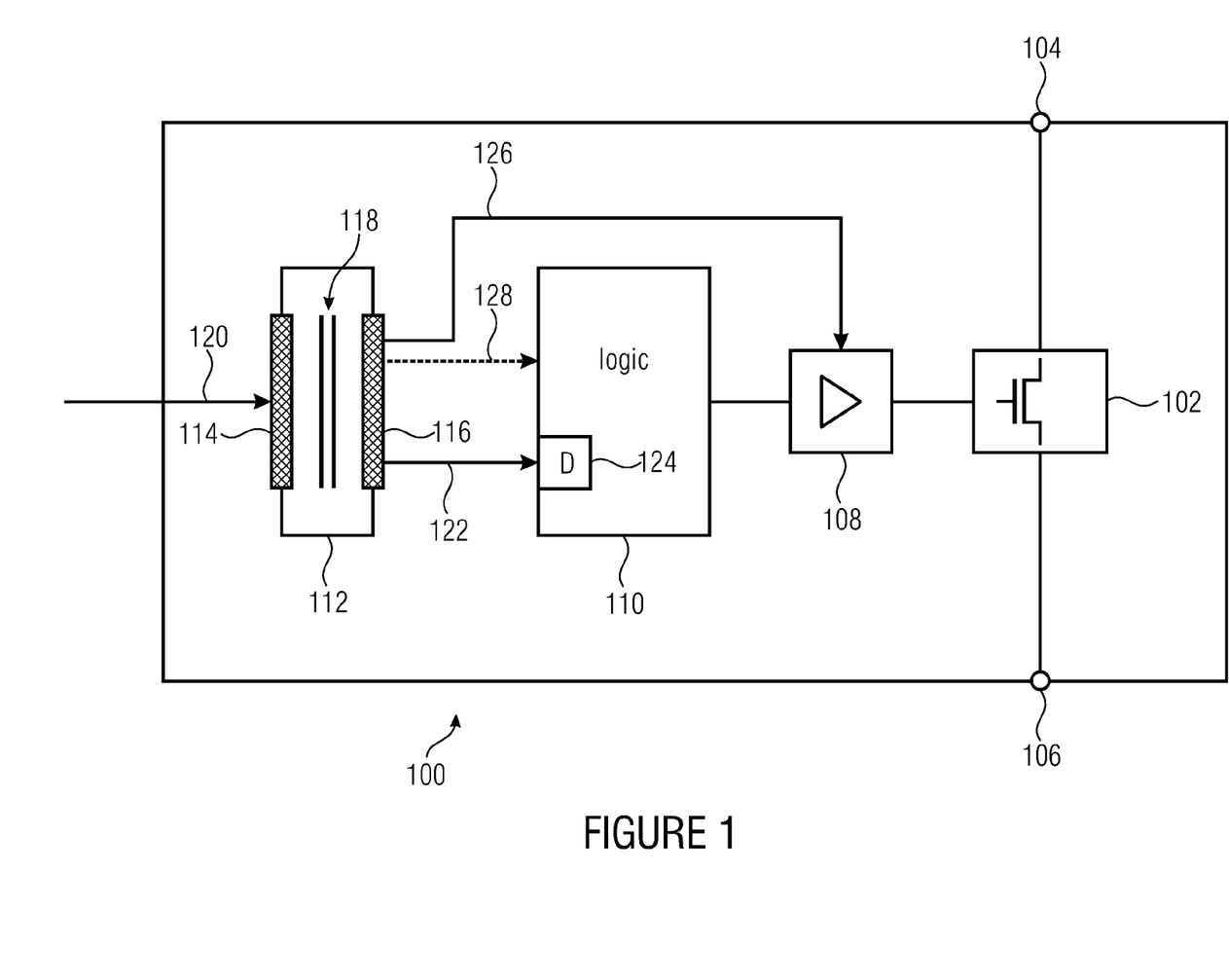
FIG. 1 is a schematic illustration of a circuit according to an embodiment of the invention.

FIG. 1 shows a schematic illustration of a circuit 100 according to an embodiment of the invention. The circuit 100 includes an active element 102, for example a power electronic switch, e.g. IGBT, FET or bipolar transistor. Alternatively, a plurality of devices including one or several active devices can be provided, for example a wiring of a plurality of transistors or a wiring of one or several transistors with further non-controlled elements, for example diodes or passive elements, such as resistors, inductive devices or capacitors, wherein, according to embodiments, these elements can also be settable via control signals.

The active element 102 is connected between a first power terminal 104 of the circuit and a second power terminal 106 of the circuit in order to operate on a power signal applied to the first power terminal 104 and to output a power signal at the second power terminal 106. Further, the circuit 100 includes a drive or control circuit 108 effectively connected to the active element 102 to output a control signal to the active element 102, for example a gate control signal in the case of an IGBT or FET, or a control signal in order to control another active or settable element. A logic circuit 110 is connected to the drive circuit 108 in order to provide an enable signal or control signal for enabling the drive circuit 108 for outputting a control signal to the active element 102.

Further, the circuit 100 includes an interface circuit 112 including a primary terminal 114 as well as a secondary terminal 116. The primary terminal 114 and the secondary terminal 116 of the interface circuit 112 are galvanically isolated, for example by arranging a transmitter or transformer 118 shown schematically in FIG. 1. The primary terminal 114 is effectively connected to the primary side of the transformer 118, and the secondary terminal 116 is effectively connected to the secondary side of the transformer 118 via a rectifier circuit for providing the auxiliary energy supply. The interface circuit 112 is provided to receive a primary signal 120 at its primary terminal 114, which includes data allowing setting or programming the control logic 110 according to desired functionalities.

According to embodiments, the control logic 110 can be programmed by using the data transmitted by the primary signal 120, in order to provide control or regulation of the active element 102 via the drive circuit 108 according to a desired functionality.

According to embodiments, it is intended that the primary signal is a square-wave signal free from steady components having an essentially constant frequency, which exists, for example in the form of a Manchester encoded signal.

According to embodiments, a serial bitstream representing the data necessitated for programming the logic 110 can be transmitted by means of the primary signal. The primary signal 120 is transmitted via the transmitter 118 to the secondary terminal 116 of the interface circuit 112, and from there the same is provided to the control circuit 110, as indicated by arrow 122.

If the primary signal includes the data in encoded form, e.g. in the form of the Manchester encoded serial bitstream, a decoder circuit 124 can be provided in such embodiments, which decodes the bitstream in order to obtain the data for setting/programming the control logic 110. In the embodiment shown in FIG. 1, the decoder 124 is illustrated as part of the control logic 116, but can be provided in other embodiments to provide the decoder as part of the interface circuit, such that the interface circuit 112 already outputs the decoded data stream. Alternatively, a decoder circuit can be provided between the interface circuit 112 and the control logic 110.

According to the present invention, the interface circuit 112 is further implemented to generate, at its secondary terminal 116, apart from the data signal which is transferred to the logic 110, an auxiliary energy signal 126 which is necessitated for controlling the drive circuit 108. Further, according to embodiments, it can be intended to provide a further auxiliary energy signal 128 as indicated by the dotted arrow, which is applied to the control logic 110 to effect its auxiliary energy supply. The secondary terminal 116 of the interface circuit 112 can include several secondary windings for providing different auxiliary energy supplies via one or several rectifier circuits, for example the auxiliary energy signals 126 and 128 illustrated based on FIG. 1.

According to embodiments, it is intended to provide the primary signal via a two-wire connection to the interface circuit 112. This procedure is advantageous when using a transformer, since it allows a connection of the two wires of a two-wire connection to the two terminals on the primary side of the transformer 11, i.e. to the first terminal of the primary winding and the second terminal of the primary winding. On the secondary side of the interface circuit 112, an auxiliary energy supply is provided for the secondary side elements of the circuit, for example the logic circuit and the drive circuit. At the same time, for example, serial data communication with the control logic 110 is enabled, which allows generation of the control signals for the drive circuit 108. The serial bitstream received at the terminal 114 and transferred to the secondary terminal 116 via the transformer 118 thus serves for energy supply and data communication. For controlling a completely bidirectional DC/DC converter, for example, a communication with 500 kBit/s can be provided. According to embodiments, the data transmission method can be selected such that the same can also be received as a trigger signal for synchronization, e.g. for realizing a phase offset operation of several power electronic units, on the secondary side.

According to embodiments, the logic unit 110 can include a microprocessor, a digital signal processor, an FPGA or ASIC. Apart from generating the control signals for the driver 108, the logic unit 110 can take on further tasks, such as further control and regulation tasks, such as current sensing at elements within the active element 102, e.g. at a coil, high-voltage measurement, low-voltage measurement, temperature measurement, predictive digital control and/or regulation for different operating modes (e.g. CCM, DCM, et al.) or synchronization.

Thus, according to the invention, a circuit is provided which prevents the problems during secure galvanically isolated control of an active element of a power electronic circuit occurring in conventional technology, and simultaneously reduces the effort with respect to the necessitated connections and simultaneously reduces the coupling capacitance. According to the invention, this is obtained, as mentioned above, in that both the signal for controlling the logic device 110, for example for programming the same, as well as the auxiliary energy signal for the different components of the circuit 100 are generated from the received primary signal 120, and the actual signal controlling the active power device (e.g. gate control signal) is generated on the side facing the power electronics (secondary side) and not, as in conventional technology, on the side facing the higher-level control unit (primary side). Thereby, only one interface is necessitated for receiving the data and the auxiliary energy, which reduces the amount of necessitated connections of the circuit 100 to the outside. Further, only one transformer 118 or one element for secure galvanic isolation is necessitated, such that the coupling capacitance is reduced and an even more reliable and secure galvanic isolation is obtained. It should be noted that the galvanic isolation via the interface is secure in that sufficient isolation (e.g. one to several kV) exists, since a user who is to be protected can be on the primary side. Here, galvanic isolation is securer than galvanic operation isolation between the logic device 100 and the power electronic components, whose isolation requirements can be lower and sometimes merely have to be sufficient to protect, for example, the logic unit.

In the following, examples for realizing a galvanically isolated circuit as shown schematically based on FIG. 1 will be discussed in more detail.

Figure 2:
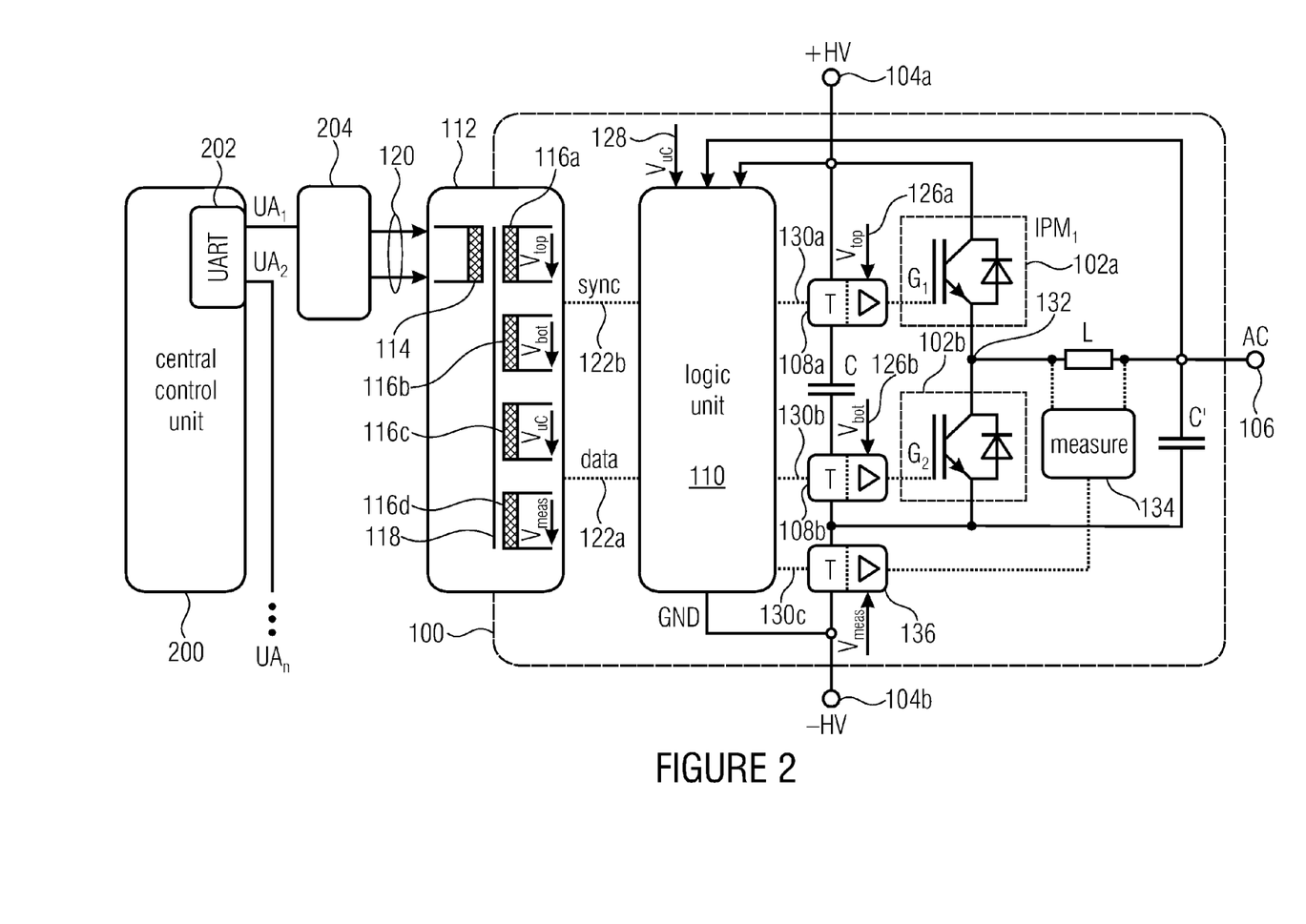
FIG. 2 is a circuit according to an embodiment of the present invention, wherein the power electronic unit includes a bidirectional boost/buck chopper.

FIG. 2 shows a realization of a circuit according to an embodiment of the present invention where the power electronic unit or the active element 102 as described based on FIG. 1 realizes a bidirectional boost/buck chopper. FIG. 2 shows the circuit 100 including a first active element 102a and a second active element 102b. The active elements 102a and 102b each include an IGBT whose emitter collector path is bridged by a diode that is reverse-biased. A respective gate drive circuit 108a, 108b is allocated to each active circuit 102a, 102b, which is effectively connected to the control logic 110 to output respective gate control signals to the drive circuits 108a, 108b as indicated by the dotted connections 130a, 130b. The interface circuit 112 includes the primary terminal 114 as well as several secondary terminals 116a to 116d. The primary terminal 114 is formed by the primary winding of the transformer 118, and the secondary terminals 116a to 116d are realized via respective secondary windings of the transformer 118 and rectifier circuits connected to the same. As schematically illustrated by the dotted line 122a and the dotted line 122b, the interface circuit 112 in the embodiment shown in FIG. 2 transmits, on the one hand, the data signal 122a and, on the other hand, a synchronization signal 122b to the control unit 110. In other embodiments, only a data signal can be provided, which additionally includes information necessitated for synchronization. Other than the auxiliary energy, the data signal is derived directly from a secondary side terminal. The first secondary winding 116a of the interface circuit 112 provides the auxiliary energy signal 126a (Vtop) for the drive circuit 108a, and the second secondary winding 116b provides the auxiliary energy signal 126b (Vbot) for the second drive circuit 108b. The third secondary winding 116c generates the energy supply signal 126 (VuC) for the control logic 110.

In the embodiment shown in FIG. 2, the drive circuits 108a and 108b include galvanic isolation elements T for galvanic operation isolation or a level shifter in order to be able to control the active elements 102a and 102b. The bidirectional boost/buck chopper shown in FIG. 2 includes a first direct voltage terminal 104a (+HV) as well as a second direct voltage terminal 104b (−HV) for receiving the positive or negative high voltage potentials. The alternating outlet AC is at the second power terminal 106. The storage capacitor C is connected between terminals 104a and 104b. The first active element 102a is connected between the first terminal 104a and an intermediate node 132, and the second active element 102b is connected between the intermediate node 132 and the second terminal 104b. The second terminal 104b is connected to the output terminal 106 via a further capacitor C'. Gates G1 and G2 are connected to the drive circuits 108a to 108b and via the same to the control logic 110, wherein it should be noted that no connection exists between the drive circuits 108a and 108b and the terminals 104a and 104b. The coil L is connected between the intermediate node 132 and the second power terminal 106, wherein coil current measurement can be effected via the circuit 134. The circuit 104 and the isolating circuit 136 are supplied with auxiliary energy (Vmeas), which is provided by the fourth secondary winding 116d of the interface circuit. The coil current measurement is communicated to the control logic 110 via a signal 130c, wherein the circuit 132 as well as the drive circuits 108a, 108b can comprise galvanic isolation T.

FIG. 2 further shows a central control unit 200, for example a microprocessor generating the control or data signals for the logic unit 110, wherein the control unit 200 comprises, e.g., an UART unit 202 for providing the data signals according to the UART standard at one or several output lines UA1 to UAn, for example for n different circuits. FIG. 2 merely shows one circuit 100 for which the data signal UA1 is generated by the central control unit 200. This signal is provided to a drive unit 204 providing the primary signal 120 at the output for transmission via the two-wire interface 112.

In the embodiment illustrated in FIG. 2, the logic unit 110 does not only serve to provide the control signals for switching the gate terminals of the active elements 102a and 102b, but the same also serves to regulate, for example, the current through the coil L. Further, for voltage regulation of the intermediate circuit voltage or the output voltage, high voltage or low voltage measurement can be performed. For that purpose, as illustrated in FIG. 2, the logic unit 110 is connected, on the one hand, to the first terminal 104a of the circuit and, on the other hand, to the second terminal 104b. Further, as illustrated by the arrow, the logic unit 110 is connected to the output 106 to sense the voltage at the AC outlet.

In the embodiment illustrated based on FIG. 2, a logic unit 110 is provided, which generates the control signals for the two active elements 102a and 102b. Here, it should be noted that the present invention is not limited to such an implementation. Rather, it can be intended to provide a control unit for only one active element or for several active elements of a circuit, wherein subsequently, based on FIG. 3, an example will be described where a circuit having two active elements comprises two logic units, one for each active element.

Figure 3:
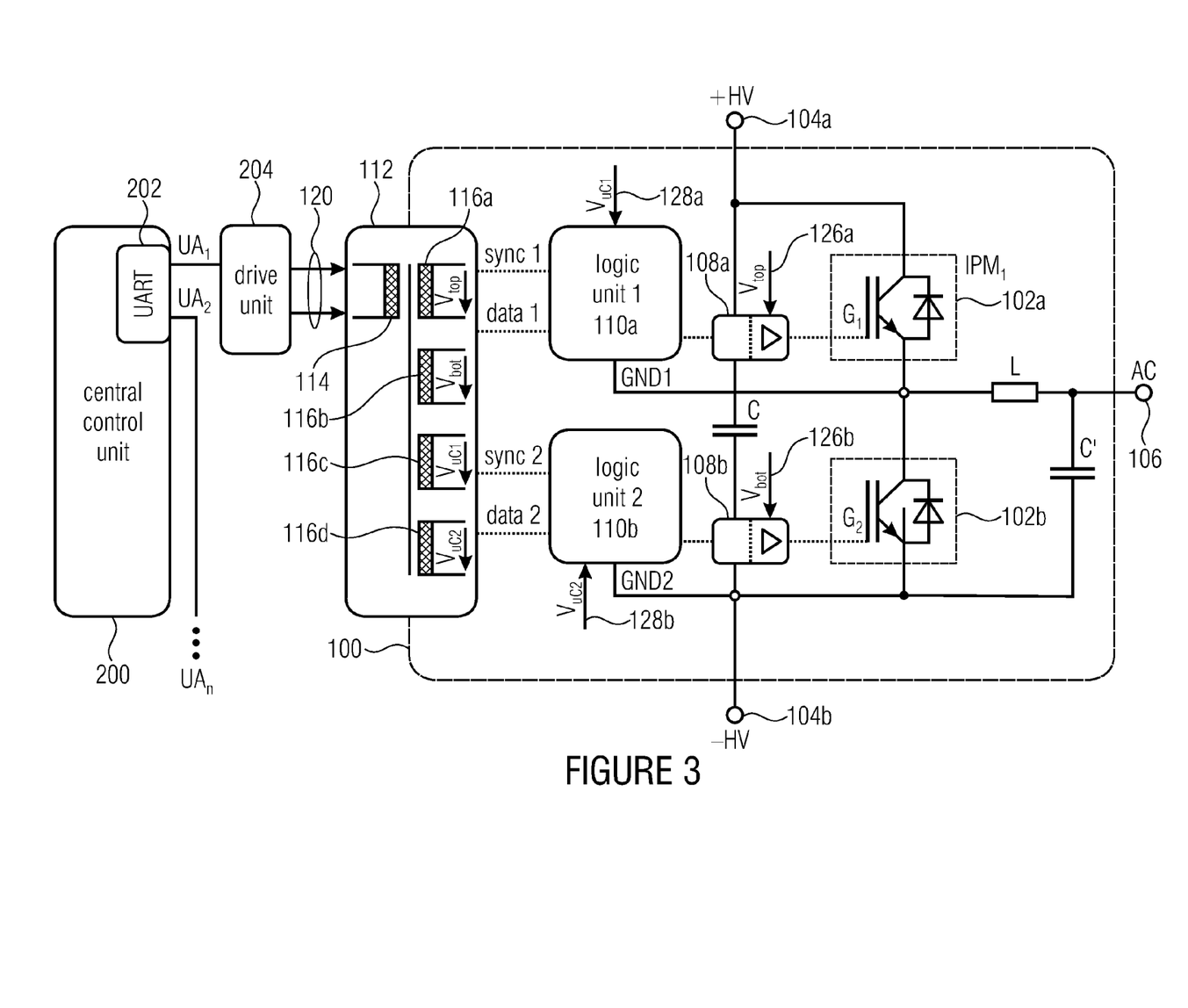
FIG. 3 is a circuit according to an embodiment of the present invention having two active elements and two logic units.

FIG. 3 illustrates a circuit similar to the circuit in FIG. 2, but without the coil current measurement circuit 132. Further, the control logic circuit shown there only serves to generate the control signals but not to sense measurement signals. Elements that are shown in FIG. 3 but that have already been described based on FIG. 2 are provided with the same reference numbers and are not discussed again. As can be seen in FIG. 3, the circuit 100 includes a first control logic 110a and a second control logic 110b, each receiving the energy supply signals 128a, 128b provided by the secondary windings 116c and 116d, as well as the respective data and/or synchronization signals 130a, 130b. The control logic circuits 110a and 110b can comprise respective addresses via which addressing the control logic circuits is possible. In the embodiment shown in FIG. 3, the first control logic 110a is connected to the node 132, and the second control logic is connected to the second terminal 104b.

As discussed above based on FIG. 2, several circuits 100 can be controlled via the central control unit 200, as indicated by the control signals UA1 to UAn. Instead of the connections of only one circuit to the two-wire connection bus as described based on FIGS. 2 and 3, according to other embodiments, a bus system can be provided where several circuits are connected in series or parallel at its primary side, as will be briefly discussed below based on FIGS. 4 and 5.

Figure 4:
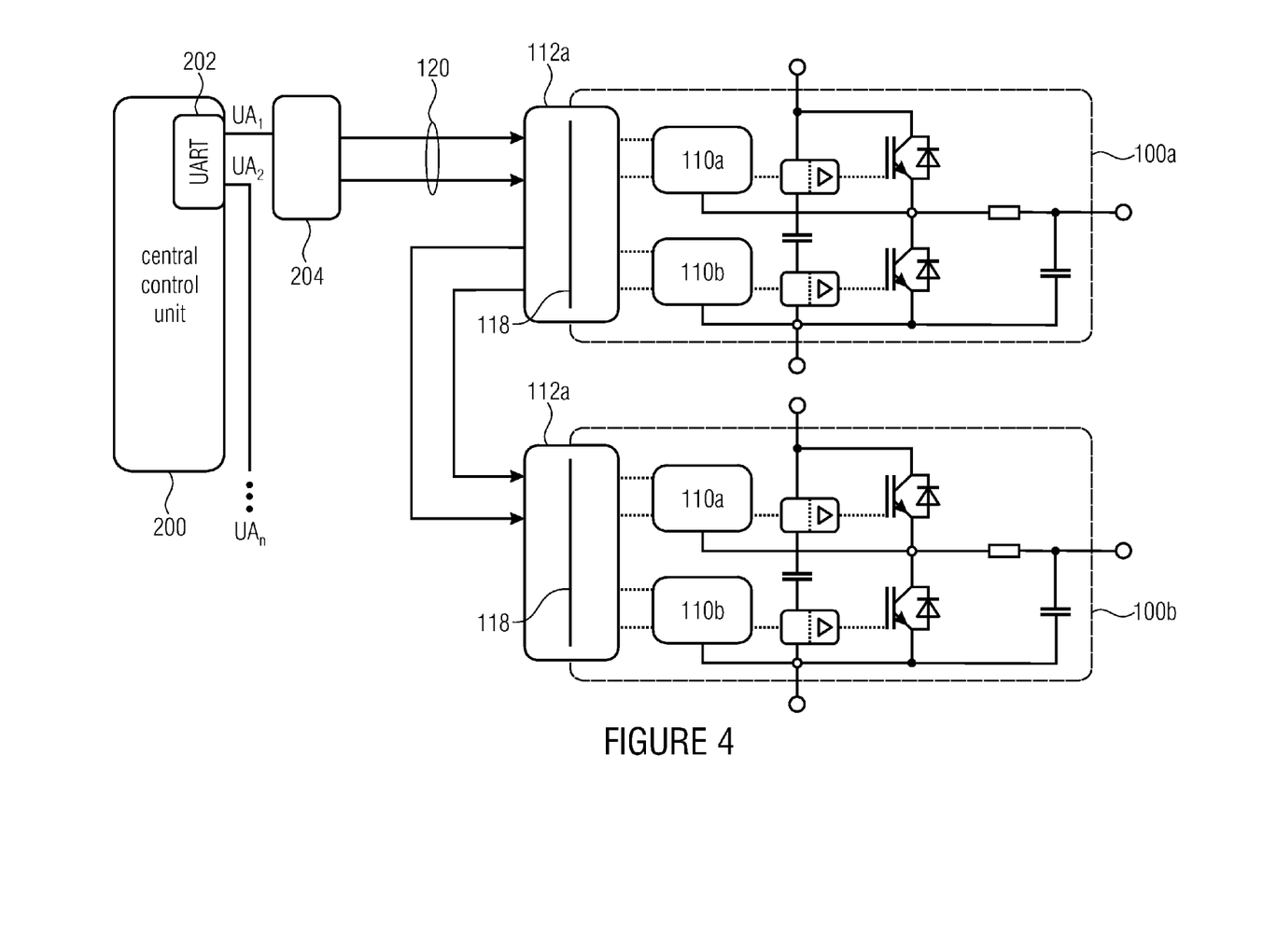
FIG. 4 is a system according to an embodiment having a central control unit, a bus system and two serially connected circuits of FIG. 3.

FIG. 4 shows an embodiment having a bus system where two circuits 100a and 100b corresponding to the circuit 100 of FIG. 3 are serially connected to one another. As can be seen, the first circuit 100a receives, in the above manner, the primary signal from the central control unit 200, which is transferred to the primary side of the circuit 100b by the primary side of the first circuit 100a, i.e. the primary windings of the two interface circuits 112 are connected in series.

Figure 5:
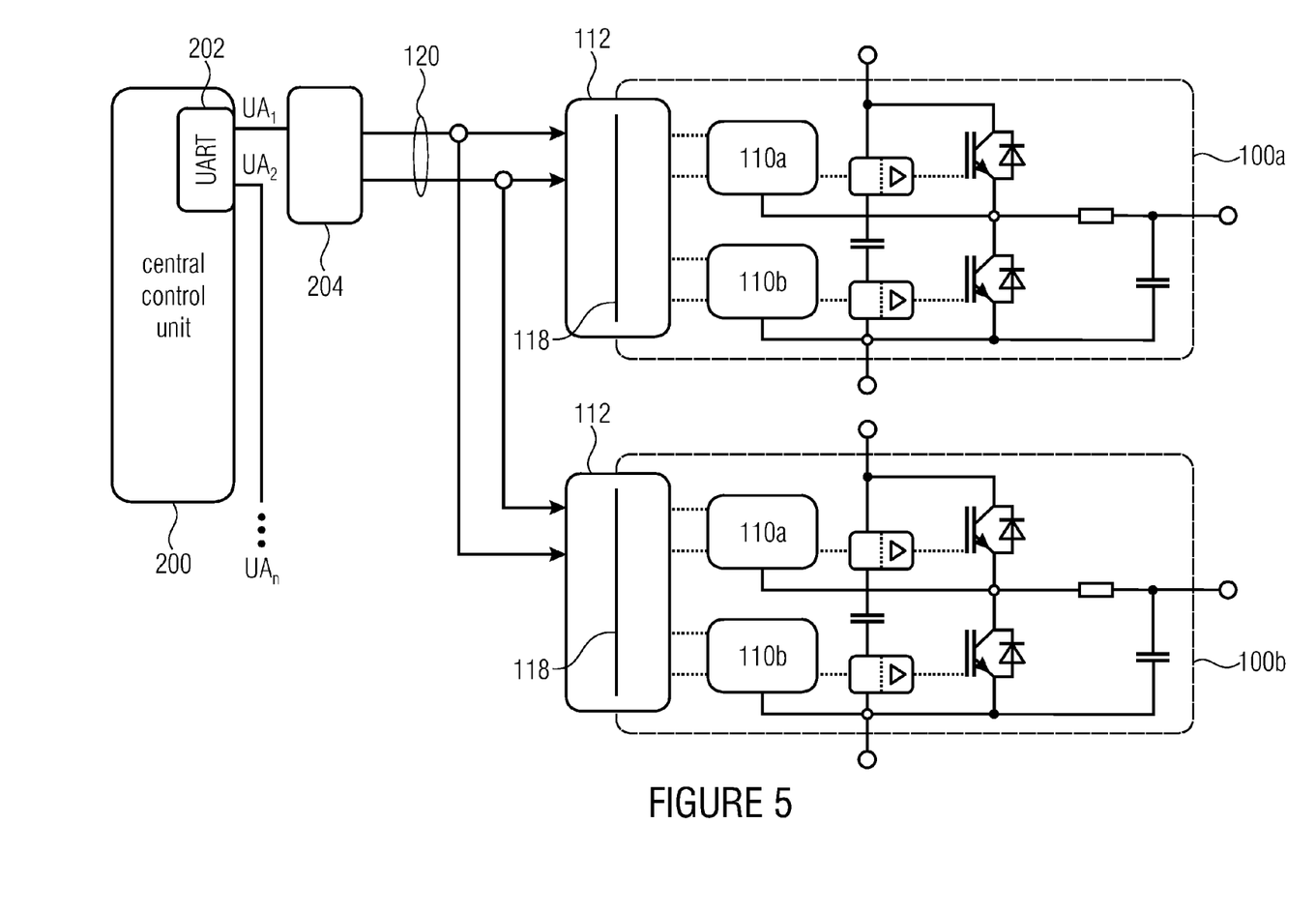
FIG. 5 is an embodiment similar to the one in FIG. 4 having two circuits of FIG. 3 connected in parallel.

FIG. 5 shows an embodiment similar to the one in FIG. 4, wherein, however, the two circuits 100a and 100b are connected in parallel, as the two-wire connection bus has a connection both to the primary side of the first circuit 100a and a connection to the primary side of the second circuit 100b, i.e. the primary windings of the two interface circuits 112 are connected in parallel.

According to further embodiments, bidirectional communication can be provided between the control logic and the central control unit, by, for example, interrupting energy transmission from the central control unit 200 to the secondary side for predetermined time periods, and instead effecting communication from the control logic 100, which is then implemented for respective communication, in the direction of the central unit 200. Here, an energy storage is necessitated on the secondary side, which takes over the energy supply of the secondary side (e.g. for the control logic 100) during this time period. Alternatively, it can also be envisaged to provide a predetermined load on the secondary side of the interface circuit, which is then detected as transmission of a predetermined data word at the central control unit 200.

While some aspects have been described in the context of an apparatus, it is obvious that these aspects also represent a description of the respective method, such that a block or a device of an apparatus can also be considered as a respective method step or as a feature of a method step. Analogously, aspects that have been described in the context of or as a method step also represent a description of a respective block or detail or feature of a respective apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A circuit, comprising
   an active element;
   a drive circuit for the active element;
   a control logic for providing a control signal for the drive circuit; and
   an interface circuit comprising a primary terminal for receiving a primary signal and a secondary terminal that is galvanically isolated from the primary terminal,
   wherein the interface circuit is implemented to provide the primary signal received at the primary terminal to the control logic via the secondary terminal, and to provide, based on the primary signal received at the primary terminal, an auxiliary energy signal for the drive circuit at the secondary terminal, and
   wherein the primary signal comprises data for setting and/or programming the control logic, wherein the primary signal comprises a waveform allowing energy transmission via the interface circuit with the galvanic isolation; and
   a decoder that is implemented to decode the primary signal for acquiring data for setting and/or programming the control logic.

2. The circuit according to claim 1, wherein the primary signal comprises a square wave signal free from steady components with essentially constant frequency.

3. The circuit according to claim 2, wherein the primary signal comprises a Manchester encoded signal.

4. The circuit according to claim 1, wherein the primary signal comprises a serial bitstream.

5. The circuit according to claim 1, wherein the control logic comprises the decoder.

6. The circuit according to claim 1, wherein the interface circuit comprises a transformer and a rectifier circuit downstream of the transformer, wherein the primary signal is applied to the primary side of the transformer, and the data signal for the control logic is acquired at its secondary side, and wherein the auxiliary energy signal for the drive circuit is provided by the rectifier circuit.

7. The circuit according to claim 1, wherein the interface circuit is implemented to provide, based on the primary signal, a further auxiliary energy signal for the control logic at the secondary terminal.

8. The circuit according to claim 1, wherein the active element and the control logic are galvanically isolated and/or connected via a respective level shifting circuit.

9. The circuit according to claim 8, wherein the drive circuit comprises an element for galvanic isolation of the active element and the control logic or the level shifting circuit.

10. The circuit according to claim 1, further comprising a first power terminal and a second power terminal, wherein the active element is connected between the first power terminal and the second power terminal.

11. The circuit according to claim 10, wherein the control logic is connected to the first power terminal and the second power terminal for sensing a measurement signal.

12. The circuit according to claim 10, further comprising a combination of several active and passive power devices defining several power terminals and/or inner nodes, wherein the control logic is, alternatively or additionally, connected to the further power terminals or inner nodes for sensing one or several measurement signals.

13. The circuit according to claim 1, further comprising:
   a measurement circuit connected to the control logic for providing a measurement signal to the same,
   wherein the interface circuit is implemented to provide, based on the received primary signal, an auxiliary energy signal for the measurement circuit at the secondary terminal by means of a rectifier circuit.

14. The circuit according to claim 1, further comprising:
   at least one further active element having a further drive circuit allocated thereto,
   wherein the interface circuit is implemented to provide, based on the primary signal, an auxiliary energy signal for the further drive circuit by means of a rectifier circuit.

15. The circuit according to claim 14, further comprising a further control logic for providing a further control signal for the further drive circuit.

16. The circuit according to claim 1, wherein the active element comprises one or several power electronic switches, such as IGBTs, FETs or bipolar transistors, whose control terminals are connected to one or several of the drive circuits.

17. The circuit according to claim 1, wherein the control logic is effective to cause, in response to the primary signal, a predetermined control of the drive circuit for the active element and/or to perform predetermined measurements or controls and/or regulations.

18. The circuit according to claim 1, wherein the interface circuit is further implemented to effect an output of a signal on the primary side.

19. The circuit according to claim 1, wherein the primary signal comprises correction and/or check information and/or encryption information for fault-tolerant and/or secure transmission.

20. A system, comprising
   a central control unit; and
   a circuit according to claim 1.

21. The system according to claim 20, further comprising a bus for transmitting the primary signal generated by the central control unit to the circuit.

22. The system according to claim 21, wherein the bus comprises a two-wire connection between the central control unit and the circuit, wherein the primary terminal of the interface circuit comprises a first terminal connected to one wire of the two-wire connection, and a second terminal connected to the other wire of the two-wire connection.

23. The system according to claim 20, further comprising at least one further circuit according to claim 1.

24. The system according to claim 23, wherein the at least one further circuit is connected to the central control unit via a further two-wire connection, or to the primary terminal of the circuit, or to the two-wire connection between the central control unit and the circuit.

* * * * *